(12) United States Patent
Kashina

(10) Patent No.: US 12,732,147 B2
(45) Date of Patent: Sep. 8, 2026

(54) ACOUSTIC PROCESSING DEVICE AND ACOUSTIC PROCESSING METHOD

(71) Applicant: Faurecia Clarion Electronics Co., Ltd., Saitama (JP)

(72) Inventor: Yuki Kashina, Saitama (JP)

(73) Assignee: FAURECIA CLARION ELECTRONICS CO., LTD., Saitama (JP)

( * ) Notice: Subject to any disclaimer, the term of this patent is extended or adjusted under 35 U.S.C. 154(b) by 47 days.

(21) Appl. No.: 18/454,953

(22) Filed: Aug. 24, 2023

(65) Prior Publication Data

US 2024/0072751 A1 Feb. 29, 2024

(30) Foreign Application Priority Data

Aug. 30, 2022 (JP) ................................ 2022-137368

(51) Int. Cl.
*H03G 5/02* (2006.01)
*H04R 5/04* (2006.01)

(52) U.S. Cl.
CPC .............. *H03G 5/025* (2013.01); *H04R 5/04* (2013.01)

(58) Field of Classification Search
CPC ..... H03G 5/025; H04S 7/301; H04S 2400/09; H04R 2499/13; H04R 2400/09
USPC .................................................... 381/97, 98
See application file for complete search history.

(56) References Cited

U.S. PATENT DOCUMENTS 5,033,092 A * 7/1991 Sadaie .................... H04S 1/002 381/86
11,355,096 B1 * 6/2022 Gandhi ........... G10K 11/17817
2008/0199017 A1 * 8/2008 Yamakawa ............. H04R 3/12 381/59
2010/0208900 A1 8/2010 Amadu et al.
2013/0243226 A1 9/2013 Tokoro et al.
(Continued)

FOREIGN PATENT DOCUMENTS

JP H08307208 A 11/1996
JP 2010532613 A 10/2010
(Continued)

OTHER PUBLICATIONS

Office action issued by the Japanese Patent Office for application 2022-137368 on Jun. 26, 2026; Informal translation included.

*Primary Examiner* — George C Monikang
(74) *Attorney, Agent, or Firm* — Reising Ethington P.C.

(57) ABSTRACT

An acoustic processing device unit is provided with: an input reception unit configured to receive an input of a value of a parameter defining a phase difference to be provided between a pair of audio signals; a filter coefficient calculation unit configured to calculate a filter coefficient group corresponding to each of the pair of audio signals based on the input value received by the input reception unit; and a filter processing unit configured to provide a phase difference defined by the input value between the pair of audio signals by performing filter processing on each of the pair of audio signals based on the filter coefficient group calculated by the filter coefficient calculation unit. The parameter above includes a center frequency of the phase difference provided between the pair of audio signals, a quality factor, and a phase difference at the center frequency.

6 Claims, 18 Drawing Sheets

(56) References Cited

U.S. PATENT DOCUMENTS

| | | | |
|---|---|---|---|
| 2016/0126915 | A1 | 5/2016 | Fukue |
| 2018/0192221 | A1 | 7/2018 | Hollinshead et al. |

FOREIGN PATENT DOCUMENTS

| | | | |
|---|---|---|---|
| JP | 2013219731 | A | 10/2013 |
| JP | 2015007850 | A | 1/2015 |
| JP | 5883580 | B2 | 3/2016 |
| JP | 2018524885 | A | 8/2018 |
| JP | 2021106359 | A | 7/2021 |

* cited by examiner

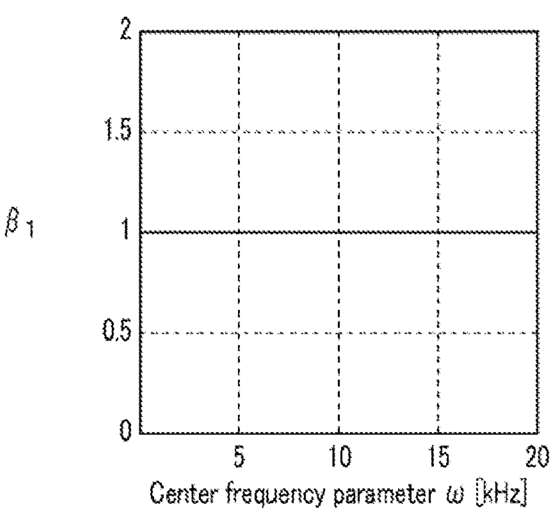
Fig. 12A
2
1.5
β 1
1
0.5
0
2
4
6
8
10
Q-value (parameter θ)
Fig. 12B
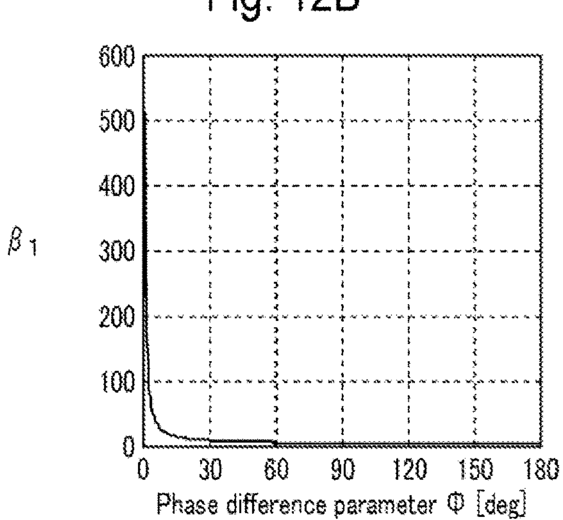
Fig. 12C

ACOUSTIC PROCESSING DEVICE AND ACOUSTIC PROCESSING METHOD

TECHNICAL FIELD

The present invention relates to an acoustic processing device and an acoustic processing method.

BACKGROUND

In a listening environment such as a vehicle interior, for example, standing waves may interfere with each other to cause a dip in a frequency region, thereby deteriorating sound quality or reducing sound pressure.

In order to suppress such a dip, for example, an acoustic processing device that parametrically controls an amplitude characteristic in a frequency domain is known. As an example, an acoustic processing device described in Patent Document 1 reads a filter coefficient group from a memory and applies the filter coefficient group to a filter. The amplitude characteristic is adjusted and the dip is suppressed by the filter processing by the filter. Patent Document 1: Japanese Unexamined Patent Application 2013-219731.

In a conventional acoustic processing device including Patent Document 1, a filter coefficient group calculated under a predetermined condition (for example, under a condition that only a gain is changed by a predetermined value and other parameters are fixed) is stored in advance in a memory. In other words, only a limited filter coefficient group is stored in the memory. Therefore, the degree of freedom of the filter is low.

In order to improve the degree of freedom of the filter, a method of calculating the filter coefficient group under the condition that each parameter is finely changed may be considered. However, in this case, it is necessary to calculate an enormous number of combinations of parameters. Since an enormous amount of time is required for the calculation processing, it is not easy to adopt such a method.

Therefore, in light of the foregoing, an object of the present application is to provide an acoustic processing device and acoustic processing method that can improve the degree of freedom of the filter.

SUMMARY

The acoustic processing device unit according to an embodiment of the present application is provided with: an input reception unit configured to receive an input of a value of a parameter defining a phase difference to be provided between a pair of audio signals; a filter coefficient calculation unit configured to calculate a filter coefficient group corresponding to each of the pair of audio signals based on the input value received by the input reception unit; and a filter processing unit configured to provide a phase difference defined by the input value between the pair of audio signals by performing filter processing on each of the pair of audio signals based on the filter coefficient group calculated by the filter coefficient calculation unit. The parameter above includes a center frequency of the phase difference provided between the pair of audio signals, a quality factor, and a phase difference at the center frequency.

According to an embodiment of the present application, an acoustic processing device and an acoustic processing method are provided wherein it is possible to improve the degree of freedom of a filter.

BRIEF DESCRIPTION OF THE DRAWINGS

FIG. 12A is a diagram for describing the function 131 used for calculating the bandwidth in step S102 of FIG. 6;

FIG. 12B is a diagram for describing the function 131 used for calculating the bandwidth in step S102 of FIG. 6;

FIG. 12C is a diagram for describing the function 131 used for calculating the bandwidth in step S102 of FIG. 6;

DETAILED DESCRIPTION OF EMBODIMENTS

The following description relates to an acoustic processing device and acoustic processing method according to an embodiment of the present application.

Figure 1:
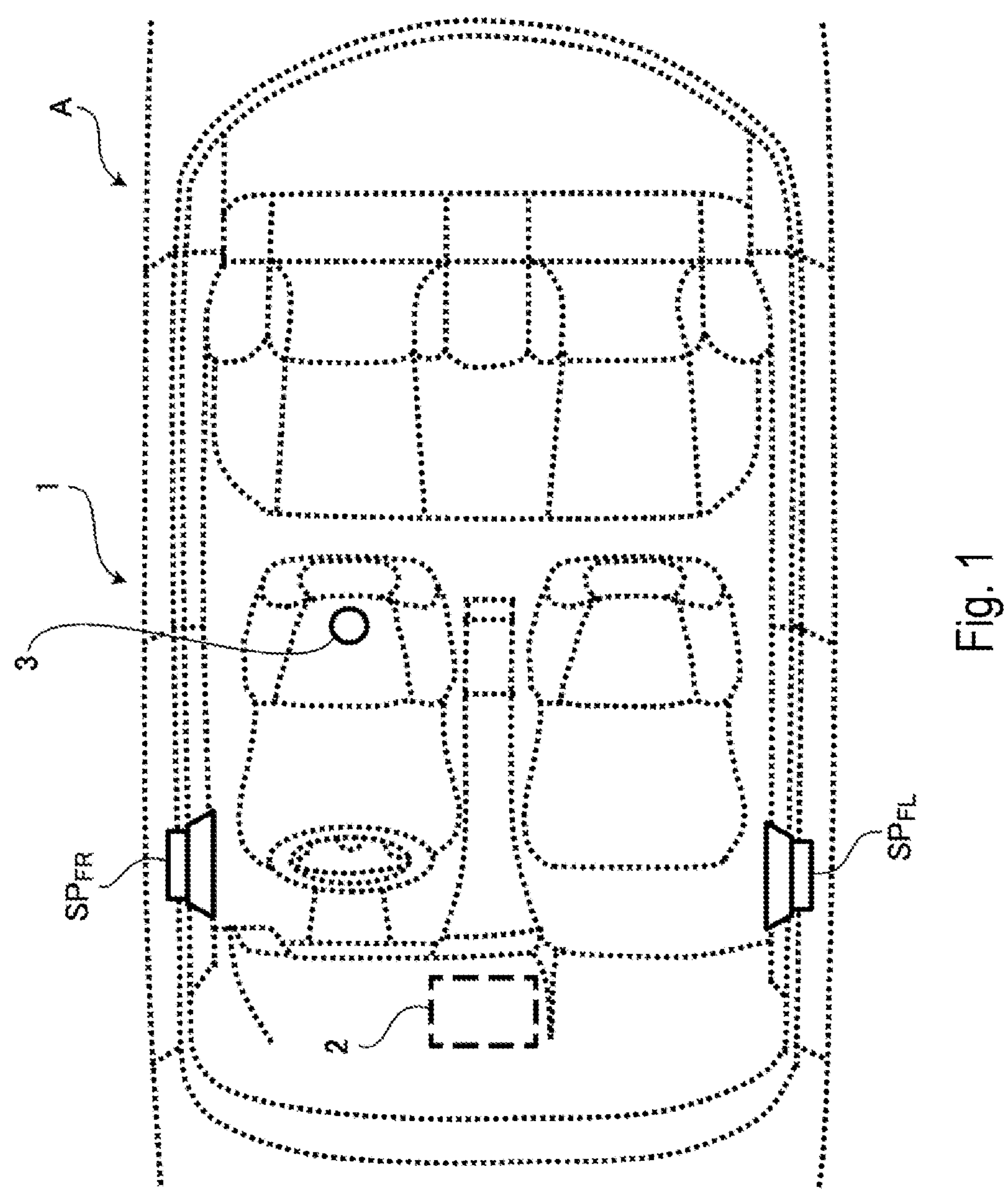
FIG. 1 is a diagram schematically illustrating a vehicle in which an acoustic processing system according to an embodiment of the present application is installed.

FIG. 1 is a diagram schematically illustrating a vehicle A (as an example, right-hand steering-wheel car) in which an acoustic processing system 1 according to an embodiment of the present application is installed. As illustrated in FIG. 1, the acoustic processing system 1 is provided with an acoustic processing device 2, a measuring device 3, and a pair of left and right speakers $SP_{FR}$ and $SP_{FL}$.

The acoustic processing device 2 is an example of a computer, and performs phase control by an Infinite Impulse Response (IIR) all-pass filter pair for a pair of transducers to reduce phase interference of a sound field. For example, the acoustic processing device 2 suppresses the occurrence of a dip in a frequency domain due to the interference of standing waves, thereby suppressing the deterioration of sound quality and the reduction of sound pressure.

The speakers $SP_{FR}$ and $SP_{FL}$ are an example of a pair of transducers. The speaker $SP_{FR}$ is a right front speaker embedded in a right door unit (driver's seat side door unit). The speaker $SP_{FL}$ is a left front speaker embedded in a left door unit (passenger's seat side left door unit).

The vehicle A may have yet another speaker (for example, rear speaker) installed (that is, three or more speakers installed). In this case, the transducer pair to be processed is not limited to the speaker $SP_{FR}$ and the speaker $SP_{FL}$. The transducer pair to be processed may be, for example, two rear speakers installed at left and right positions of a rear seat. Furthermore, the transducer pair to be processed may be the speaker $SP_{FR}$ and any one of the rear speakers, or may be the speaker $SP_{FL}$ and any one of the rear speakers.

The measuring device 3 is a well-known device that measures a frequency characteristic of sound, and is installed at a predetermined listening point (a driver's seat, a front passenger's seat, a rear seat, or the like). The measuring device 3 collects sounds output from the speakers $SP_{FR}$ and $SP_{FL}$ using a microphone, analyzes a frequency characteristic of the collected sounds, and displays the analyzed frequency characteristic on a display unit.

An operator (user) confirms the frequency characteristic displayed on the display unit of the measuring device 3. For example, when a dip is confirmed, the operator inputs, into the acoustic processing device 2, a parameter value suitable for reducing the phase interference of the sound field at the listening point. Here, the parameters are parameters for calculating a filter coefficient group to be applied to the all-pass filter pair, and specifically, are the center frequency of the phase difference between the pair of audio signals, the quality factor, and the phase difference at the center frequency.

Hereinafter, the parameters of the center frequency, the quality factor (also referred to as Q-value), and the phase difference at the center frequency input by the operator are referred to as a center frequency parameter $\omega$, a quality factor parameter $\theta$, and a phase difference parameter $\varphi$, respectively.

The measuring device 3 may not be installed at the listening point. In this case, the operator sits at the listening point and inputs a parameter value suitable for reducing the phase interference of the sound field at the listening point into the acoustic processing device 2 while checking the sound actually heard. That is, the operator may adjust the sound field at the listening point depending on his/her own auditory sense.

Hereinafter, the audio signal of the R channel corresponding to the speaker $SP_{FR}$ will be referred to as audio signal $S_R$. Also, the L channel audio signal corresponding to the speaker $SP_{FL}$ will be referred to as an audio signal $S_L$.

A phase difference is provided between a pair of audio signals (between the audio signal $S_R$ and the audio signal $S_L$) by the all-pass filter pair to which the filter coefficient group is applied. Hereinafter, the phase difference between the audio signal $S_R$ and the audio signal $S_L$ is referred to as a phase difference PH in order to be distinguished from the phase difference (phase difference parameter $\varphi$) at the center frequency.

In the present embodiment, the operator can provide an appropriate phase difference PH between the audio signal $S_R$ and the audio signal $S_L$ by inputting an appropriate parameter value into the acoustic processing device 2, thereby suppressing occurrence of a dip in a frequency domain due to the interference of standing waves and suppressing the deterioration of sound quality and the reduction in sound pressure.

Figure 2:
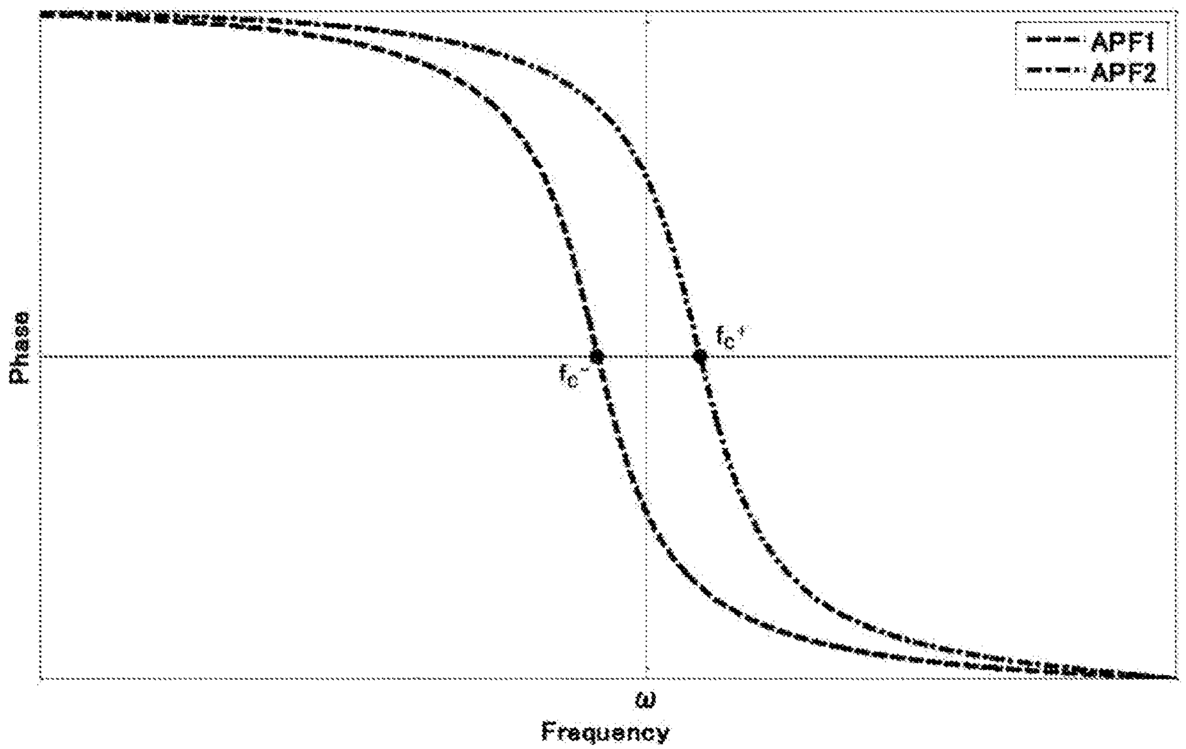
FIG. 2 is a diagram illustrating an example of a phase difference provided by an all-pass filter pair.
Figure 3:
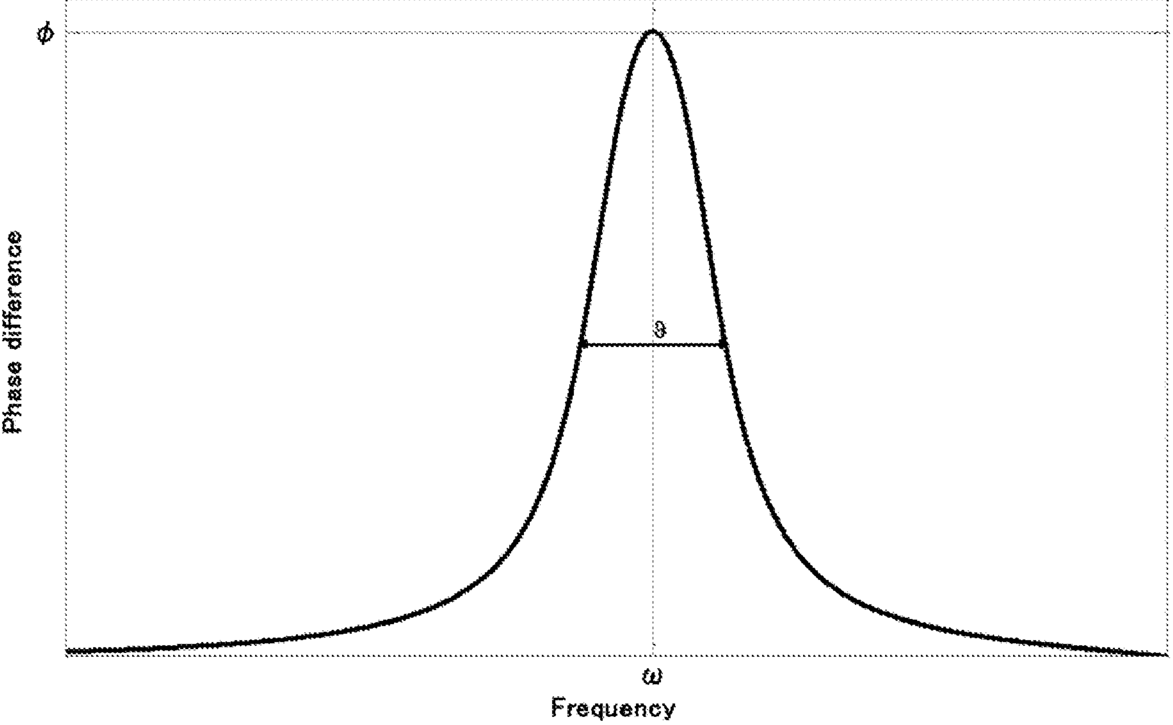
FIG. 3 is a diagram illustrating an example of a phase difference provided by an all-pass filter pair.

FIGS. 2 and 3 are diagrams illustrating an example of the phase difference PH provided by the all-pass filter pair. In FIG. 2, the vertical axis (linear axis) represents the phase, and the horizontal axis (logarithmic axis) represents frequency. In FIG. 2, the broken line illustrated by reference numeral APF1 illustrates the phase characteristic of the all-pass filter corresponding to the L channel. Frequencies at intersections of the broken line APF1 and the horizontal axis are band edge frequencies $f_C{}^-$ to be described later. The alternate long and short dash line illustrated by reference numeral APF2 illustrates a phase characteristic of the all-pass filter corresponding to the R channel. The frequencies at the intersections of the alternate long and short dash line APF2 and the horizontal axis are band edge frequencies $f_C{}^+$ to be described later.

In FIG. 3, the vertical axis (linear axis) illustrates the phase difference, and the horizontal axis (logarithmic axis) illustrates the frequency. FIG. 3 illustrates the phase difference PH which is a difference between the phase characteristics illustrated in FIG. 2. As illustrated in FIG. 3, the phase difference PH is determined by each value of the center frequency parameter $\omega$, the quality factor parameter $\theta$, and the phase difference parameter $\varphi$.

Here, in the conventional configuration, only the filter coefficient group stored in advance in the memory can be used to execute the filter processing. In this configuration, since only a limited filter coefficient group can be used, it is difficult to realize the adjustment of the phase difference PH by the all-pass filter pair with high resolution. Further, it is necessary to secure a storage area for storing a large number of filter coefficient groups in the memory.

On the other hand, the acoustic processing device 2 is configured to apply the phase difference PH input by the operator (for example, the phase difference defined by the values of the center frequency parameter ω, the quality factor parameter θ, and the phase difference parameter φ illustrated in FIG. 3) between the pair of audio signals by the all-pass filter pair. That is, the acoustic processing device 2 calculates a filter coefficient group based on the values of the center frequency parameter ω, the quality factor parameter θ, and the phase difference parameter input by the operator, performs filter processing based on the calculated filter coefficient group, and gives the phase difference PH indicated by the operator to the audio signal pair.

In the acoustic processing device 2, since the filter can be set based on an arbitrary parameter value, the degree of freedom of the filter is higher than that of the conventional configuration. Further, it is not necessary to secure a storage area for storing a large number of filter coefficient groups in the memory.

Figure 4:
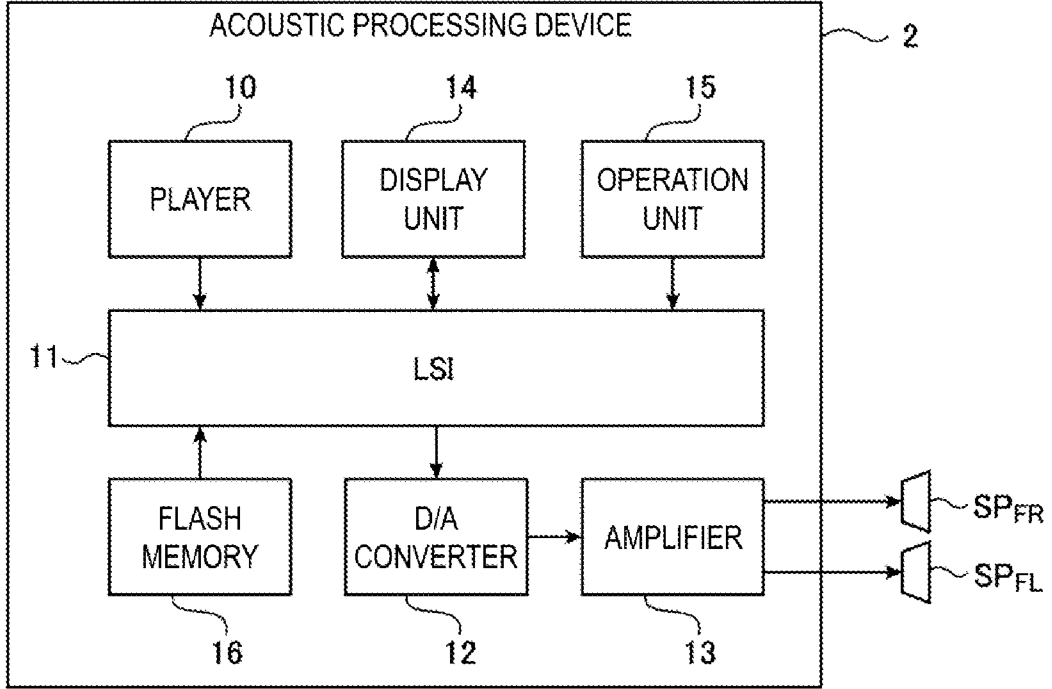
FIG. 4 is a block diagram illustrating a hardware configuration of an acoustic processing device according to an embodiment of the present application.

FIG. 4 is a block diagram illustrating a hardware configuration of the acoustic processing device 2. As illustrated in FIG. 4, the acoustic processing device 2 is provided with a player 10, an LSI (Large Scale Integration) 11, a D/A converter 12, an amplifier 13, a display unit 14, an operation unit 15, and a flash memory 16.

The player 10 is connected to a sound source. The player 10 plays an audio signal input from the sound source, which is then output to the LSI 11.

Examples of the sound source include disc media such as CDs (Compact Discs), SACDs (Super Audio CDs), and the like, and storage media such as HDDs (Hard Disk Drive), USBs (Universal Serial Bus), and the like that store digital audio data. A telephone (for example, a feature phone or smartphone) may be the sound source. In this case, the player 10 outputs a voice signal during a call input from the telephone through to the LSI 11.

The LSI 11 is provided with a CPU (Central Processing Unit), RAM (Random Access Memory), ROM (Read Only Memory), and the like. The CPU of the LSI 11 includes a single processor or a multiprocessor (in other words, at least one processor) that executes a program written in the ROM of the LSI 11, and comprehensively controls the acoustic processing device 2.

The LSI 11 executes a program developed in a work area such as a RAM to receive input of a value of a parameter (specifically, the center frequency parameter ω, the quality factor parameter θ, and the phase difference parameter φ) defining the phase difference PH to be provided between the pair of audio signals, calculates the filter coefficient group corresponding to each of the pair of audio signals based on the received input value, and perform filter processing on each of the pair of audio signals based on the calculated filter coefficient group to provide the phase difference PH defined by the input value between the pair of audio signals.

By executing the program, for example, a suitable phase difference PH is provided between the audio signal $S_R$ and the audio signal $S_L$, occurrence of a dip in a frequency domain due to the interference of standing waves is suppressed, and deterioration in sound quality and reduction in sound pressure are suppressed.

The audio signals $S_R$ and $S_L$ after the filter processing by the LSI 11 are converted to an analog signal by the D/A converter 12. The analog signal is amplified by the amplifier 13 and output to the speakers $SP_{FR}$ and $SP_{FL}$. As a result, music recorded in the sound source, for example, is reproduced in the vehicle interior from the speakers $SP_{FR}$ and $SP_{FL}$.

In the present embodiment, a vehicle-mounted acoustic processing system 1 is exemplified. However, even in a listening environment such as a room of a building, a dip may occur in a frequency domain due to interference of standing waves at a listening point. Therefore, the acoustic processing system 1 may be implemented for listening environments other than a vehicle interior.

The display unit 14 is a device that displays various screens, such as a settings screen, and examples include displays such as LCDs (Liquid Crystal Displays) and organic EIs (Electro Luminescence). The display unit 14 may be configured to include a touch panel.

The operation unit 15 includes operators such as switches, buttons, knobs, and wheels, that are mechanical systems, capacitance non-contact systems, membrane systems, or the like. When the display unit 14 includes a touch panel, the touch panel also forms a portion of the operation unit 15.

For example, when the operator inputs values of the center frequency parameter ω, the quality factor parameter θ, and the phase difference parameter φ using the operation unit 15, a phase difference PH (see FIG. 3) corresponding to these input values is displayed on the display unit 14. The operator can change the shape of the curved line (in other words, change the value of at least one of the center frequency parameter ω, the quality factor parameter θ, and the phase difference parameter φ) by touching and sliding a portion of the curved line indicating the phase difference PH on the touch panel, for example.

Figure 5:
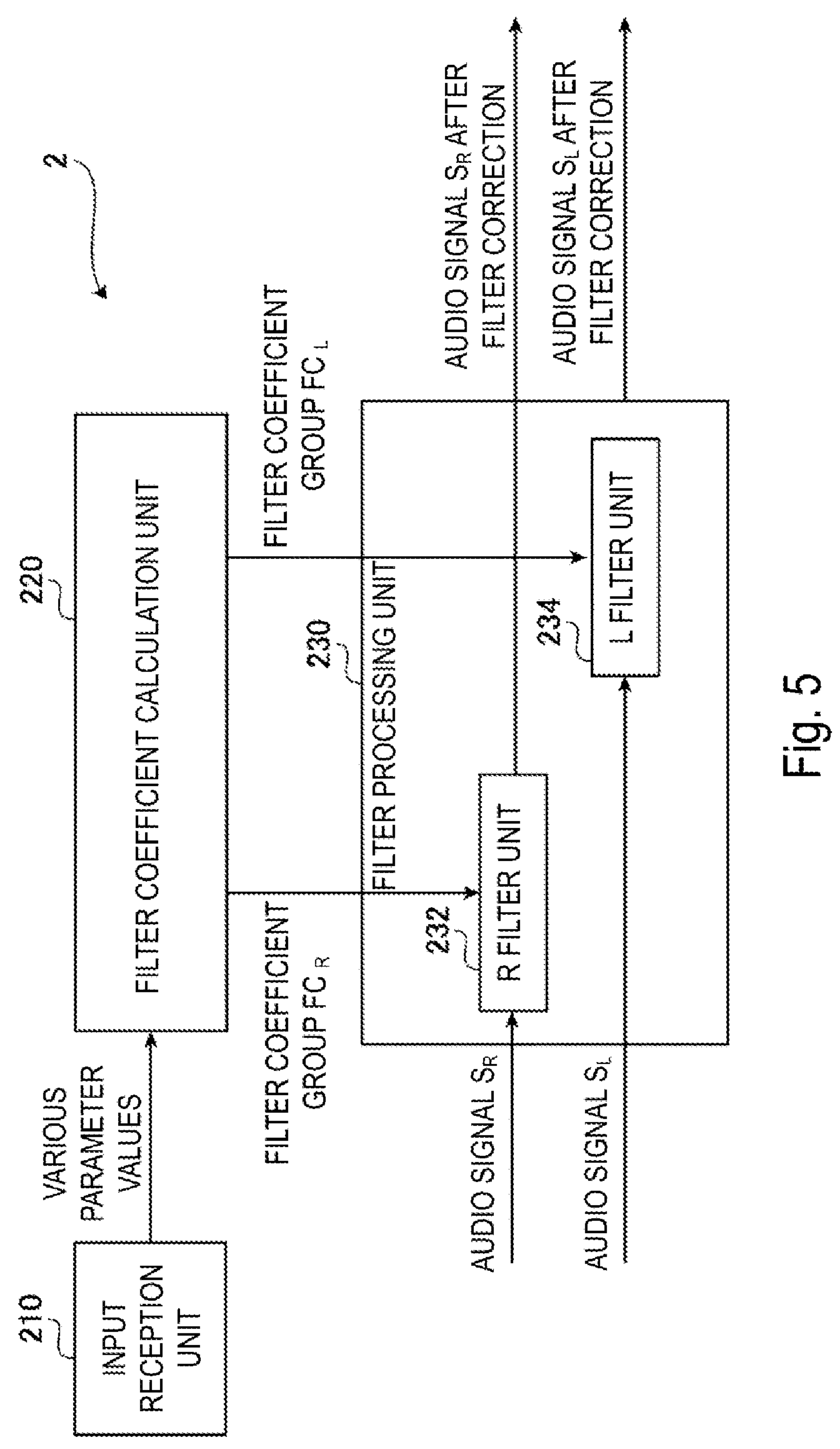
FIG. 5 is a functional block diagram of the acoustic processing device according to an embodiment of the present application.

FIG. 5 is a functional block diagram of the acoustic processing device 2. The functions illustrated in each block in the functional block diagram are executed by cooperation of software and hardware provided in the acoustic processing system 1.

As illustrated in FIG. 5, the acoustic processing device 2 includes, as functional blocks, an input reception unit 210, a filter coefficient calculation unit 220, and a filter processing unit 230. The filter processing unit 230 includes an R filter unit 232 and an L filter unit 234.

The input reception unit 210 receives an input by an operator using the operation unit 15, which is an input of a value of a parameter defining a phase difference to be provided between a pair of audio signals.

The filter coefficient calculation unit 220 calculates a filter coefficient group corresponding to each of the pair of audio signals based on the input value received by the input reception unit 210.

Specifically, the filter coefficient calculation unit 220 calculates a filter coefficient group $FC_R$ (an example of a first filter coefficient group) corresponding to the R channel and a filter coefficient group $FC_L$ (an example of a second filter coefficient group) corresponding to the L channel based on the values of the center frequency parameter ω, the quality factor parameter θ, and the phase difference parameter φ input using the operation unit 15.

The filter processing unit 230 performs filter processing on each of the pair of audio signals based on the filter coefficient group calculated by the filter coefficient calculation unit 220, thereby providing the phase difference PH defined by the input value between the pair of audio signals.

The R filter unit 232 is an example of a first all-pass filter, and the filter coefficient group $FC_R$ is applied thereto. The L filter unit 234 is an example of a second all-pass filter, and the filter coefficient group $FC_L$ is applied thereto. The R filter unit 232 and the L filter unit 234 constitute, for example, a direct form I IIR all-pass filter.

To the R filter unit 232, the audio signal $S_R$ of the R channel is input from the player 10 and the filter coefficient group $FC_R$ is input from the filter coefficient calculation unit 220. The R filter unit 232 performs filter processing on the audio signal $S_R$ using the filter coefficient group $FC_R$.

To the L filter unit 234, the audio signal $S_L$ of the L channel is input from the player 10 and the filter coefficient group $FC_L$ is input from the filter coefficient calculation unit 220. The L filter unit 234 performs filter processing on the audio signal $S_L$ using the filter coefficient group $FC_L$.

As a result of the filtering processing performed by the R filter unit 232 and the L filter unit 234, the phase difference PH (the phase difference defined by the values of the center frequency parameter ω, the quality factor parameter θ, and the phase difference parameter φ) specified by the operator is provided given to the audio signal pair. The audio signals $S_R$ and $S_L$ to which the phase difference PH is provided are output as sound into the vehicle interior by the speakers $SP_{FR}$ and $SP_{FL}$ via the D/A converter 12 and the amplifier 13. By providing a suitable phase difference PH in the R filter unit 232 and the L filter unit 234, occurrence of a dip in a frequency domain due to the interference of standing waves is suppressed, and deterioration of sound quality and reduction in sound pressure are suppressed.

A method of calculating a filter coefficient group by the filter coefficient calculation unit 220 will be specifically described.

Characteristics of the R filter unit 232 and the L filter unit 234 are expressed as in Equation 1, using a biquad transfer function H(z) of Z transform. In Equation 1, $a_0$, $a_1$, and $a_2$ represent filter coefficients of the denominator of the biquad transfer function H(z). $b_0$, $b_1$, and $b_2$ represent filter coefficients of the numerator of the biquad transfer function H(z). The filter coefficient calculation unit 220 calculates a total of the above six filter coefficients for each of the R channel and the L channel.

$$H(z) = \frac{b_0 + b_1 z^{-1} + b_2 z^{-2}}{a_0 + a_1 z^{-1} + a_2 z^{-2}} \quad \text{(Equation 1)}$$

Equation 2 is derived when normalization is performed so that the filter coefficient $a_0$ becomes 1 in Equation 1. Further, by transforming Equation 2, the characteristics of the R filter unit 232 and the L filter unit 234 implemented as direct form I can be expressed by Equation 3. In Equation 3, y represents the output signal and x represents the input signal.

$$H(z) = \frac{\left(\frac{b_0}{a_0}\right) + \left(\frac{b_1}{a_0}\right)z^{-1} + \left(\frac{b_2}{a_0}\right)z^{-2}}{1 + \left(\frac{a_1}{a_0}\right)z^{-1}\left(\frac{a_2}{a_0}\right)z^{-2}} \quad \text{(Equation 2)}$$

$$y[n] = \left(\frac{b_0}{a_0}\right)x[n] + \left(\frac{b_1}{a_0}\right)x[n-1] + \left(\frac{b_2}{a_0}\right)x[n-2] - \left(\frac{a_1}{a_0}\right)y[n-1] - \left(\frac{a_2}{a_0}\right)y[n-2] \quad \text{(Equation 3)}$$

The R filter unit 232 and the L filter unit 234, which are all-pass filters, can be represented as analog prototype filters having a transfer function H(s) as in Equation 4.

$$H(s) = \frac{s^2 - \frac{s}{Q} + 1}{s^2 + \frac{s}{Q} + 1} \quad \text{(Equation 4)}$$

A filter coefficient group (six filter coefficients $a_0$, $a_1$, $a_2$, $b_0$, $b_1$, and $b_2$) shown in the following Equation 5 is derived from Equations 3 and 4. In order to derive Equation 5, for example, a known bilinear transform is used, but the method of deriving Equation 5 is not limited thereto.

$$b_0 = 1 - \alpha$$

$$b_1 = -2\cos\omega_0$$

$$b_2 = 1 + \alpha$$

$$a_0 = 1 + \alpha$$

$$a_1 = -2\cos\omega_0$$

$$a_2 = 1 - \alpha \quad \text{(Equation 5)}$$

Further, intermediate variables $\omega_0$ and a included in Equation 5 are represented by Equations 6 and 7, respectively. In Equation 6, $f_0$ represents the center frequency of the filter calculated by the filter coefficient calculation unit 220. In Equation 7, β represents the bandwidth of the filter calculated by the filter coefficient calculation unit 220.

$$\omega_0 = 2\pi f_0 \quad \text{(Equation 6)}$$

$$\alpha = \sin(\omega_0)\sinh\left(\frac{\ln 2}{2} \cdot \beta \cdot \frac{\omega_0}{\sin\omega_0}\right) \quad \text{(Equation 7)}$$

Figure 6:
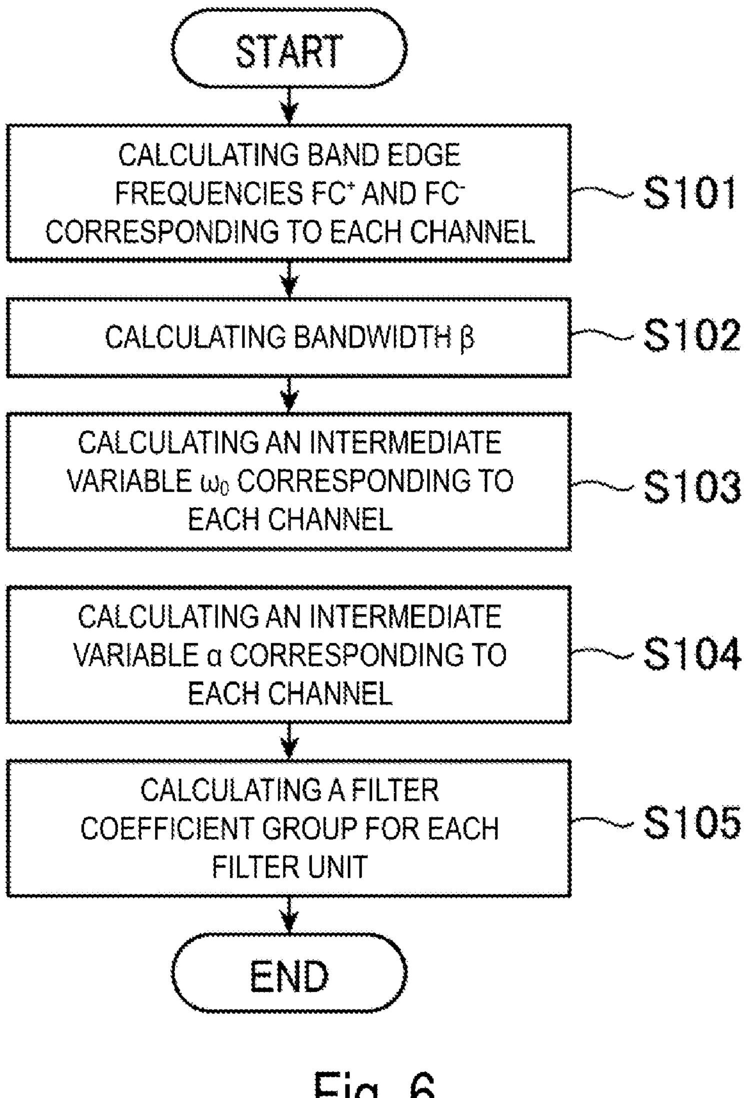
FIG. 6 is a diagram illustrating a flowchart of filter coefficient calculation processing executed in an embodiment of the present application.

FIG. 6 illustrates a flowchart of a filter coefficient calculation process executed in the filter coefficient calculation unit 220.

The filter coefficient calculation unit 220 calculates band edge frequencies $f_C^+$ and $f_C^-$ corresponding to the R channel and the L channel, respectively (step S101).

The filter coefficient calculation unit 220 obtains a bandwidth 13 based on the band edge frequencies $f_C^+$ and $f_C^-$ calculated in step S101 (step S102).

The filter coefficient calculation unit 220 further substitutes the band edge frequency $f_C^+$ as the center frequency $f_0$ into Equation 6 to calculate the intermediate variable $\omega_0$ corresponding to the R channel, and substitutes the band edge frequency $f_C^-$ as the center frequency $f_0$ into Equation 6 to calculate the intermediate variable $\omega_0$ corresponding to the L channel (step S103).

The filter coefficient calculation unit 220 substitutes the bandwidth 13 and the intermediate variable $\omega_0$ corresponding to the R channel into Equation 7 to calculate the intermediate variable α corresponding to the R channel, and substitutes the bandwidth β and the intermediate variable $\omega_0$ corresponding to the L channel into Equation 7 to calculate the intermediate variable α corresponding to the L channel (step S104).

The filter coefficient calculation unit 220 substitutes the intermediate variables $\omega_0$ and a corresponding to the R channel into Equation 5 to obtain the filter coefficient group $FC_R$, and substitutes the intermediate variables $\omega_0$ and a corresponding to the L channel into Equation 5 to obtain the filter coefficient group $FC_L$ (step S105).

Next, the filter coefficient calculation processing illustrated in FIG. 6 will be described more specifically.

In step S101, the band edge frequencies $f_C^+$ and $f_C^-$ are obtained by using the functions $f_1(\omega, \theta, \varphi)$ and $f_2(\omega, \theta, \varphi)$ with the center frequency parameter ω, the quality factor parameter θ and the phase difference parameter φ as variables, respectively.

The distance D on the frequency axis (logarithmic axis) between the band edge frequencies $f_C^+$ and $f_C^-$ calculated by the function $f_1(\omega, \theta, \varphi)$ and the function $f_2(\omega, \theta, \varphi)$ has a negative correlation with the quality factor parameter θ and a positive correlation with the phase difference parameter φ. According to the function $f_1(\omega, \theta, \varphi)$ and the function $f_2(\omega, \theta, \varphi)$, the band edge frequencies $f_C^+$ and $f_C^-$ are calculated, being symmetrical centered on a center frequency (a value of the center frequency parameter ω, hereinafter given the reference numeral $f_C$) on a frequency axis (for example, a logarithmic axis) in consideration of human auditory characteristics.

Figure 7:
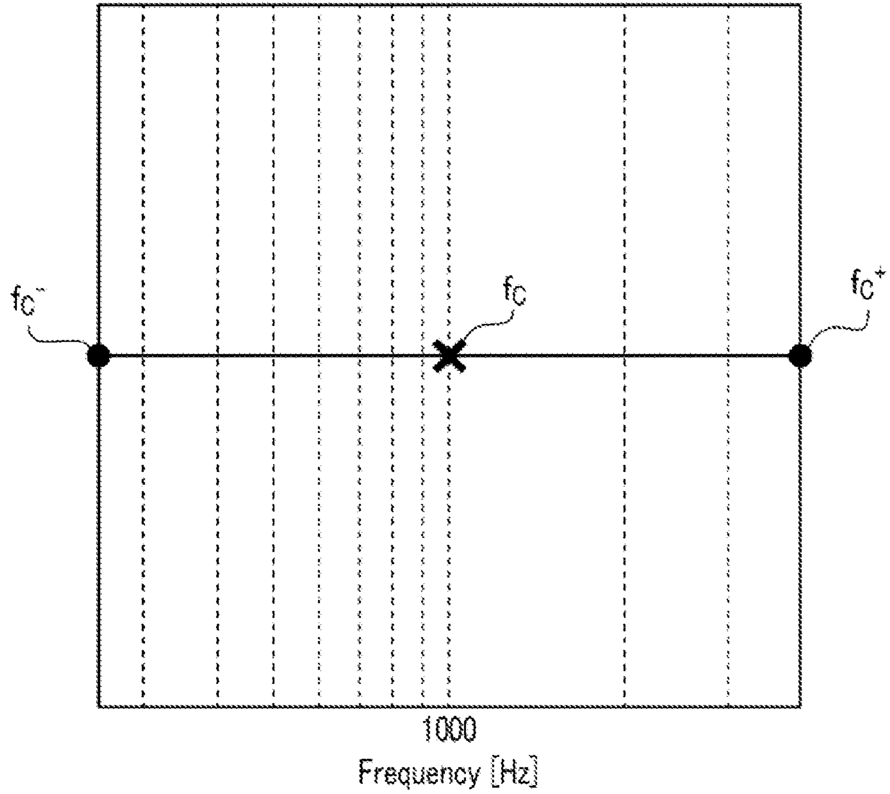
FIG. 7 is a diagram illustrating a relationship between a center frequency and a pair of band edge frequencies located around the center frequency in an embodiment of the present application.

FIG. 7 is a diagram illustrating the relationship between the center frequency $f_C$ and the band edge frequencies $f_C^+$ and $f_C^-$. In FIG. 7, the horizontal axis represents frequency, which is represented by a logarithmic axis. As illustrated in FIG. 7, frequencies at positions symmetrical on the logarithmic axis centered on the center frequency $f_C$ are calculated as band edge frequencies $f_C^+$ and $f_C^-$ by the functions $f_1(\omega, \theta, \varphi)$ and $f_2(\omega, \theta, \varphi)$.

The characteristics of the function $f_1(\omega, \theta, \varphi)$ and the function $f_2(\omega, \theta, \varphi)$ will be described with reference to FIG. 8A, FIG. 8B, FIG. 9A, FIG. 9B, FIG. 10A and FIG. 10B.

Figure 8A:
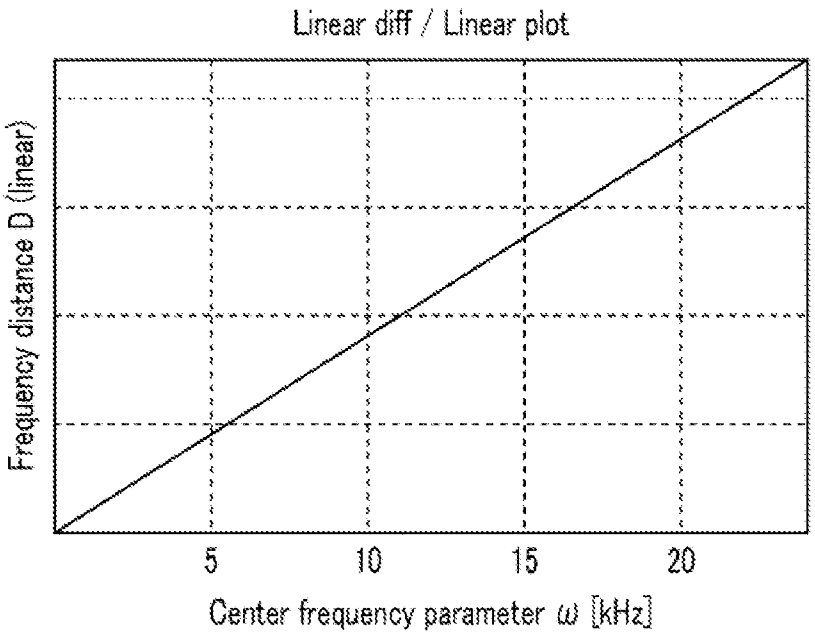
FIG. 8A is a diagram illustrating a relationship between a center frequency parameter and a distance between a pair of band edge frequencies on a frequency axis in an embodiment of the present application.
Figure 8B:
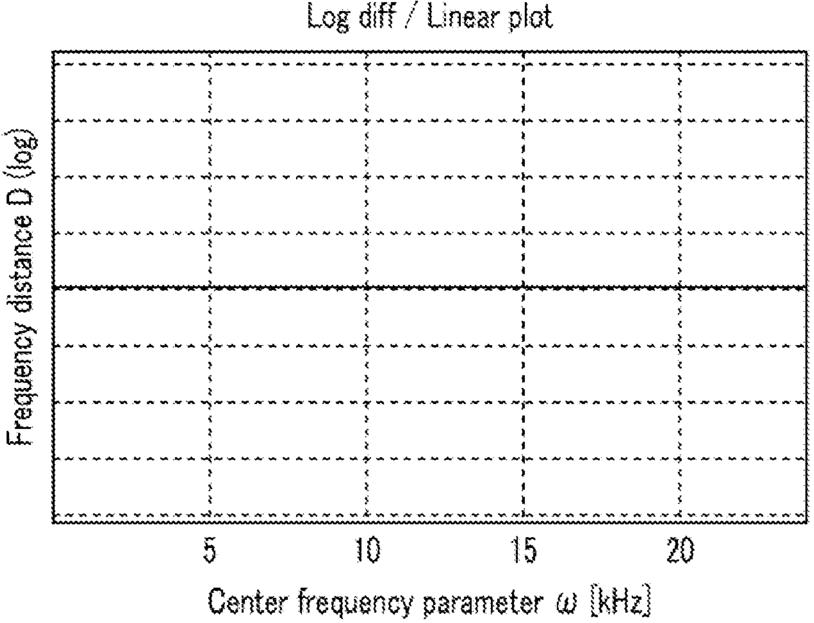
FIG. 8B is a diagram illustrating a relationship between a center frequency parameter and a distance between a pair of band edge frequencies on a frequency axis in an embodiment of the present application.

FIG. 8A and FIG. 8B are diagrams that illustrate the distance D when the values of the quality factor parameter θ and the phase difference parameter φ are fixed and the value of the center frequency parameter ω is changed. In each of FIG. 8A and FIG. 8B, the vertical axis represents the distance D, and the horizontal axis represents the center frequency parameter ω.

Figure 9A:
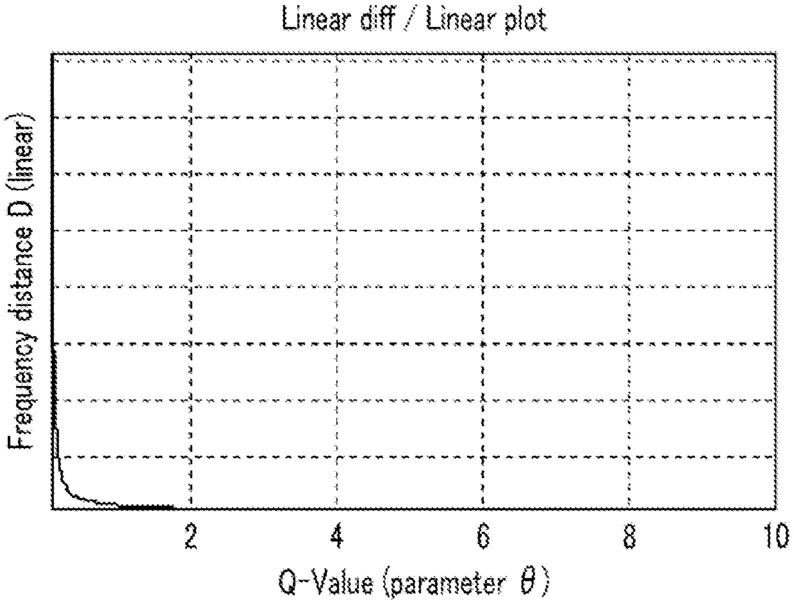
FIG. 9A is a diagram illustrating a relationship between a quality factor parameter and a distance between a pair of band edge frequencies on a frequency axis in an embodiment of the present application.
Figure 9B:
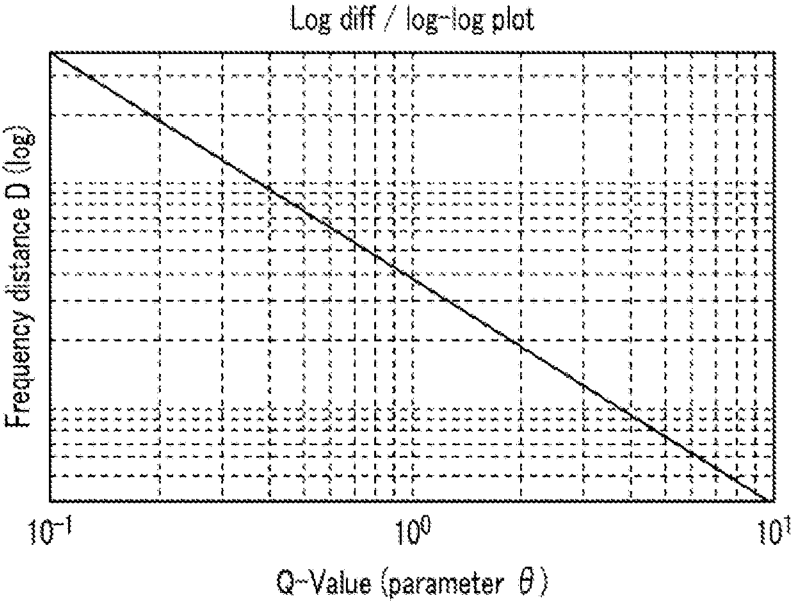
FIG. 9B is a diagram illustrating a relationship between a quality factor parameter and a distance between a pair of band edge frequencies on a frequency axis in an embodiment of the present application.

FIG. 9A and FIG. 9B are diagrams that illustrate the distance D when the values of the center frequency parameter ω and the phase difference parameter φ are fixed and the value of the quality factor parameter θ (Q value) is changed. In each of FIG. 9A and FIG. 9B, the vertical axis represents the distance D, and the horizontal axis represents the quality factor parameter θ.

Figure 10A:
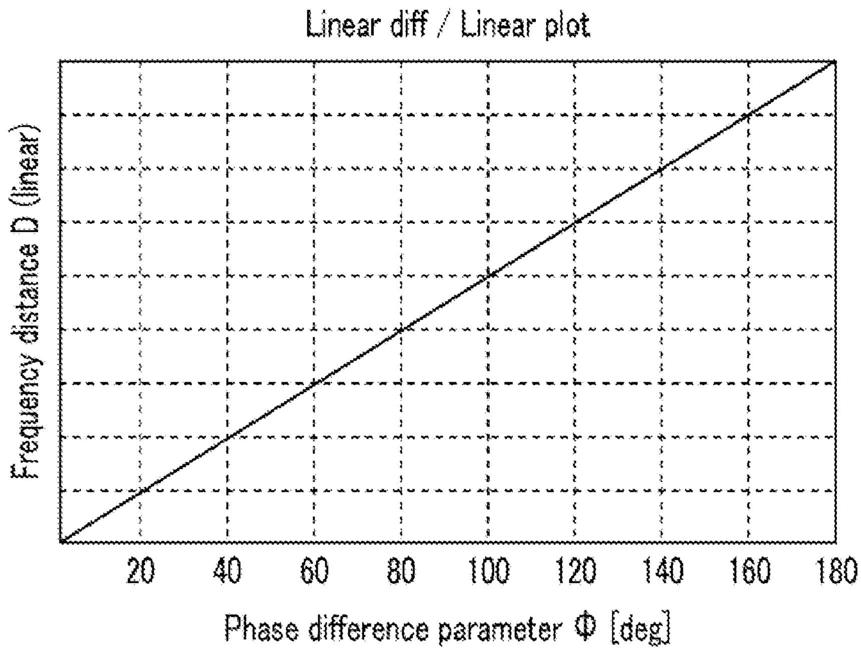
FIG. 10A is a diagram illustrating a relationship between a phase difference parameter and a distance between a pair of band edge frequencies on a frequency axis in an embodiment of the present application.
Figure 10B:
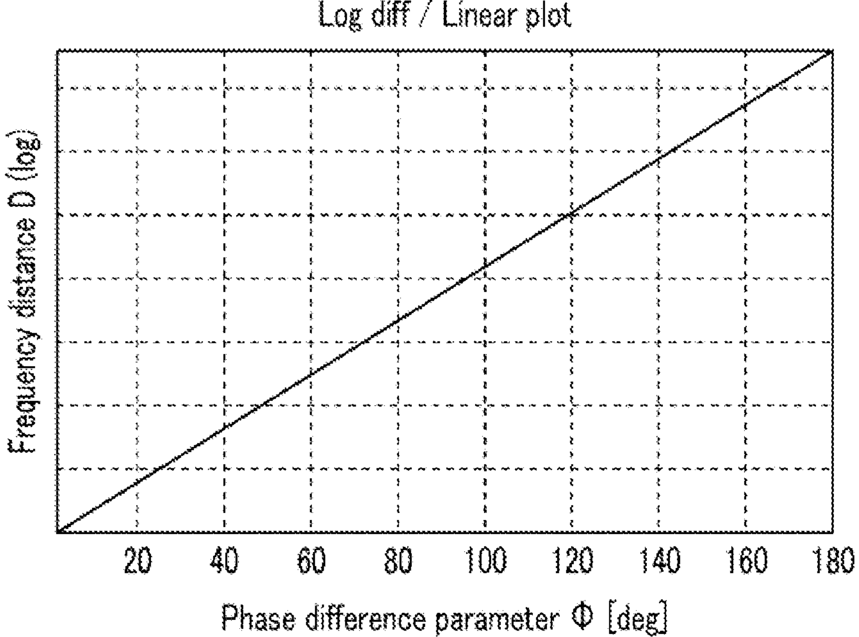
FIG. 10B is a diagram illustrating a relationship between a phase difference parameter and a distance between a pair of band edge frequencies on a frequency axis in an embodiment of the present application.

FIG. 10A and FIG. 10B are diagrams that illustrate the distance D when the values of the center frequency parameter ω and the quality factor parameter θ are fixed and the value of the phase difference parameter φ is changed. In each of FIG. 10A and FIG. 10B, the vertical axis represents the distance D, and the horizontal axis represents the phase difference parameter φ.

Drawings labeled "Linear diff" show the distance D on the linear axis. Drawings labeled "Log diff" show the distance D on the logarithmic axis. Drawings labeled "Linear plot" show the horizontal axis as a linear axis. Drawings labeled "log-log plot" show a log-log graph (log-log axis).

As illustrated in FIG. 8B, the distance D is constant on the logarithmic axis regardless of the value of the center frequency parameter ω. As illustrated in FIG. 9A and FIG. 9B, the distance D has a negative correlation with the quality factor parameter θ (particularly on the log-log axes). As illustrated in FIG. 10A and FIG. 10B, the distance D has a positive correlation with the phase difference parameter φ.

In step S101, band edge frequencies $f_C^+$ and $f_C^-$ are calculated using the function $f_1(\omega, \theta, \varphi)$ and the function $f_2(\omega, \theta, \varphi)$. The distance D on the frequency axis between the band edge frequencies $f_C^+$ and $f_C^-$ calculated by these functions has a negative correlation with the quality factor parameter θ and a positive correlation with the phase difference parameter φ. Furthermore, the band edge frequencies $f_C^+$ and $f_C^-$ calculated by these functions appear at positions symmetrical centered on the center frequency $f_C$ on the logarithmic axis in which the human auditory characteristics are taken into consideration.

In this way, the filter coefficient calculation unit 220 calculates the band edge frequency $f_C^+$ (an example of the frequency of the first control target for one of the pair of audio signals) and the band edge frequency $f_C^-$ (an example of the frequency of the second control target for the other of the pair of audio signals) based on the input values (the values of the center frequency parameter ω, the quality factor parameter θ, and the phase difference parameter φ).

In addition, the filter coefficient calculation unit 220 gives the input values to the function $f_1(\omega, \theta, \varphi)$ (an example of a first function) and the function $f_2(\omega, \theta, \varphi)$ (an example of a second function) to obtain one of a pair of frequencies (for example, the band-end frequency $f_C^+$) located symmetrically around the center frequency on the logarithmic axis as the frequency of the first control object and the other of the pair of frequencies (for example, the band edge frequency $f_C^-$) as the frequency of the second control object. The distance D, which is the difference value between the function $f_1(\omega, \theta, \varphi)$ and the function $f_2(\omega, \theta, \varphi)$, has a negative correlation with the quality factor parameter θ and has a positive correlation with the phase difference parameter φ.

For example, a constant term (numerically, for example, a value in consideration of a ⅓ octave band) in consideration of human auditory characteristics may be incorporated into the function $f_1(\omega, \theta, \varphi)$ and the function $f_2(\omega, \theta, \varphi)$.

Furthermore, a parametric equalizer is widely known as a technique for adjusting amplitude. In the parametric equalizer, for example, a center frequency, a bandwidth, and a gain are adopted as input parameters. Therefore, an adjustment term for approximating the curve of the peak determined by the input values of the center frequency parameter ω, the quality factor parameter θ, and the phase difference parameter φ (see FIG. 3) to the curve of the Q value determined by the input values (center frequency, bandwidth, gain) of the parametric equalizer may be incorporated into the function $f_1(\omega, \theta, \varphi)$ and the function $f_2(\omega, \theta, \varphi)$. By incorporating such an adjustment term, for example, an operator who is familiar with the operation of the parametric equalizer can easily perform the adjustment operation of the phase difference by the acoustic processing device 2.

In step S102, the bandwidth β is determined by Equation 8.

$$\beta = \beta_0 \cdot \beta_1 \cdot \beta_2 \quad \text{(Equation 8)}$$

However, $$\beta_0 = \frac{f_c^+ - f_c^-}{\omega},\ \beta_1 = \frac{180}{|\Phi|},\ \beta_2 = \frac{360 - |\Phi|}{90}$$

The characteristics of Expression 8 will be described using the FIG. 11A to FIG. 11C, FIG. 12A to FIG. 12C, and FIG. 13A to FIG. 13C.

Figure 11A:
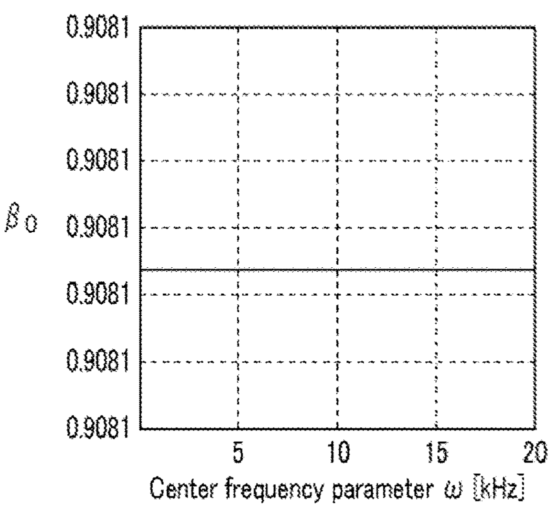
FIG. 11A is a diagram for describing the reference term $\beta_0$ used for calculating a bandwidth in step S102 of FIG. 6.
Figure 13A:
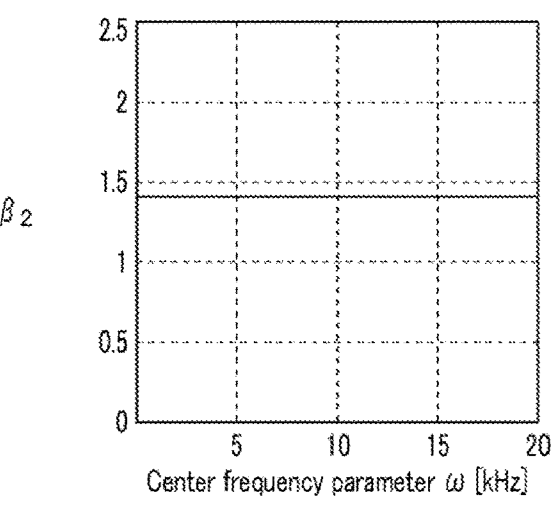
FIG. 13A is a diagram for describing the function $\beta_2$ used for calculating the bandwidth in step S102 of FIG. 6.

FIG. 11A, FIG. 12A, and FIG. 13A respectively illustrate values of a reference term $\beta_0$, the function $\beta_1$, and the function $\beta_2$ when the values of the quality factor parameter θ and the phase difference parameter φ are fixed and the value of the center frequency parameter ω is changed. In each of FIG. 11A, FIG. 12A, and FIG. 13A, the vertical axis represents the reference term $\beta_0$, the function $\beta_1$, and the function $\beta_2$. The horizontal axis represents the center frequency parameter ω.

Figure 11B:
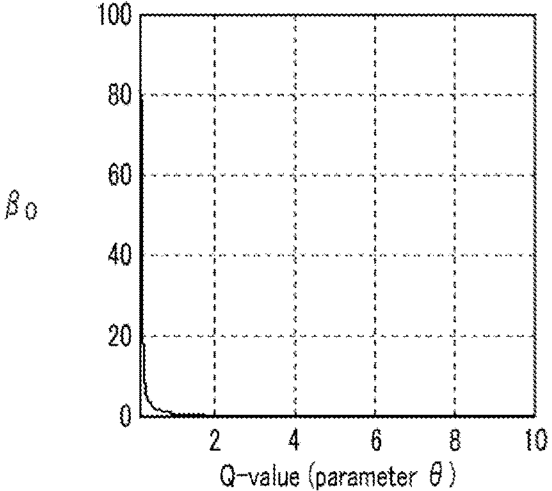
FIG. 11B is a diagram for describing the reference term $\beta_0$ used for calculating a bandwidth in step S102 of FIG. 6.
Figure 13B:
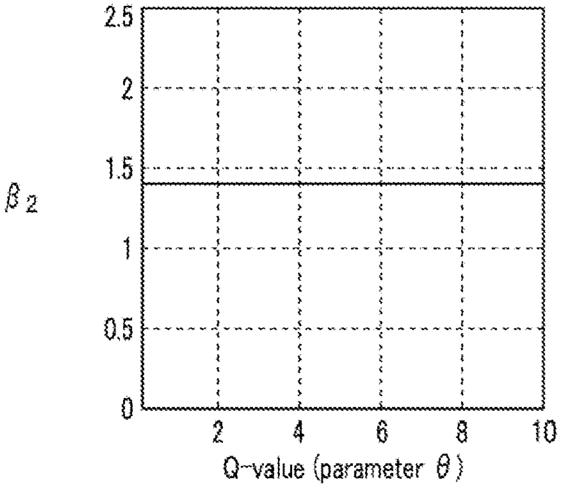
FIG. 13B is a diagram for describing the function $\beta_2$ used for calculating the bandwidth in step S102 of FIG. 6.

FIG. 11B, FIG. 12B, and FIG. 13B are diagrams that respectively show the values of the reference term $\beta_0$, the function $\beta_1$, and the function $\beta_2$ when the values of the center frequency parameter ω and the phase difference parameter $\varphi$ are fixed and the value of the quality factor parameter $\theta$ (Q value) is changed. In each of FIG. 11B, FIG. 12B, and FIG. 13B, the vertical axis represents the reference term $\beta_0$, the function $\beta_1$, and the function $\beta_2$. The horizontal axis represents the quality factor parameter $\theta$.

Figure 11C:
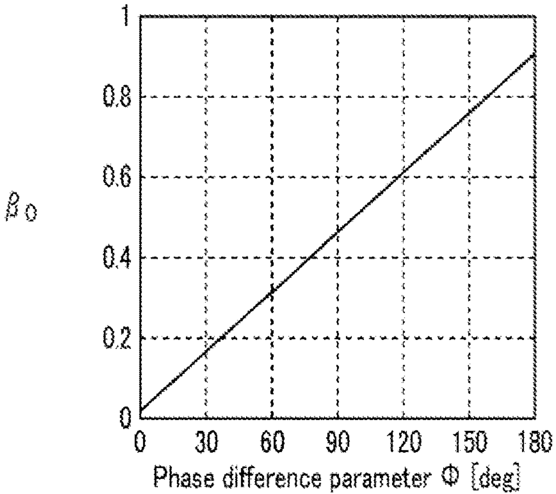
FIG. 11C is a diagram for describing the reference term $\beta_0$ used for calculating a bandwidth in step S102 of FIG. 6.
Figure 13C:
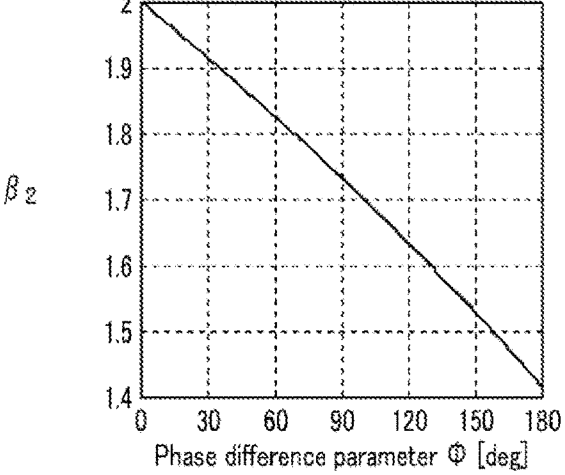
FIG. 13C is a diagram for describing the function $\beta_2$ used for calculating the bandwidth in step S102 of FIG. 6.

FIG. 11C, FIG. 12C, and FIG. 13C respectively illustrate values of the reference term $\beta_0$, the function $\beta_1$, and the function $\beta_2$ when the values of the center frequency parameter $\omega$ and the quality factor parameter $\theta$ are fixed and the value of the phase difference parameter $\varphi$ is changed. In each of FIG. 11C, FIG. 12C, and FIG. 13C, the vertical axis represents the reference term $\beta_0$, the function $\beta_1$, and the function $\beta_2$. The horizontal axis represents the phase difference parameter $\varphi$.

In these drawings, the fixed value of the center frequency parameter $\omega$ is 1000 (kHz), the fixed value of the quality factor parameter $\theta$ is 1, and the fixed value of the phase difference parameter $\varphi$ is 180°.

As illustrated in FIG. 11A, the reference term $\beta_0$ is constant regardless of the value of the center frequency parameter $\omega$. As illustrated in FIG. 11B and FIG. 11C, the reference term $\beta_0$ varies depending on the quality factor parameter $\theta$ and the phase difference parameter $\varphi$. More specifically, the reference term $\beta_0$ changes as the difference absolute value between the band edge frequencies $f_C^+$ and $f_C^-$ changes in accordance with the quality factor parameter $\theta$. In addition, the reference term $\beta_0$ changes as the difference absolute value above changes according to the phase difference parameter $\Phi$. Therefore, the reference term Po can be expressed as, for example, "a term obtained by a difference absolute value between the band edge frequencies $f_C^+$ and $f_C^-$ and the center frequency parameter $\omega$."

As illustrated in each of FIG. 12A and FIG. 12B, the function $\beta_1$ is constant regardless of the value of the center frequency parameter $\omega$, and is constant regardless of the value of the quality factor parameter $\theta$. However, the function $\beta_1$ varies depending on the phase difference parameter $\varphi$ as illustrated in FIG. 12C.

As illustrated in each of FIG. 13A and FIG. 13B, the function (32 is also constant regardless of the value of the center frequency parameter $\omega$, and is also constant regardless of the value of the quality factor parameter $\theta$. The function (32 also changes according to the phase difference parameter $\varphi$ as illustrated in FIG. 13C.

Figure 14:
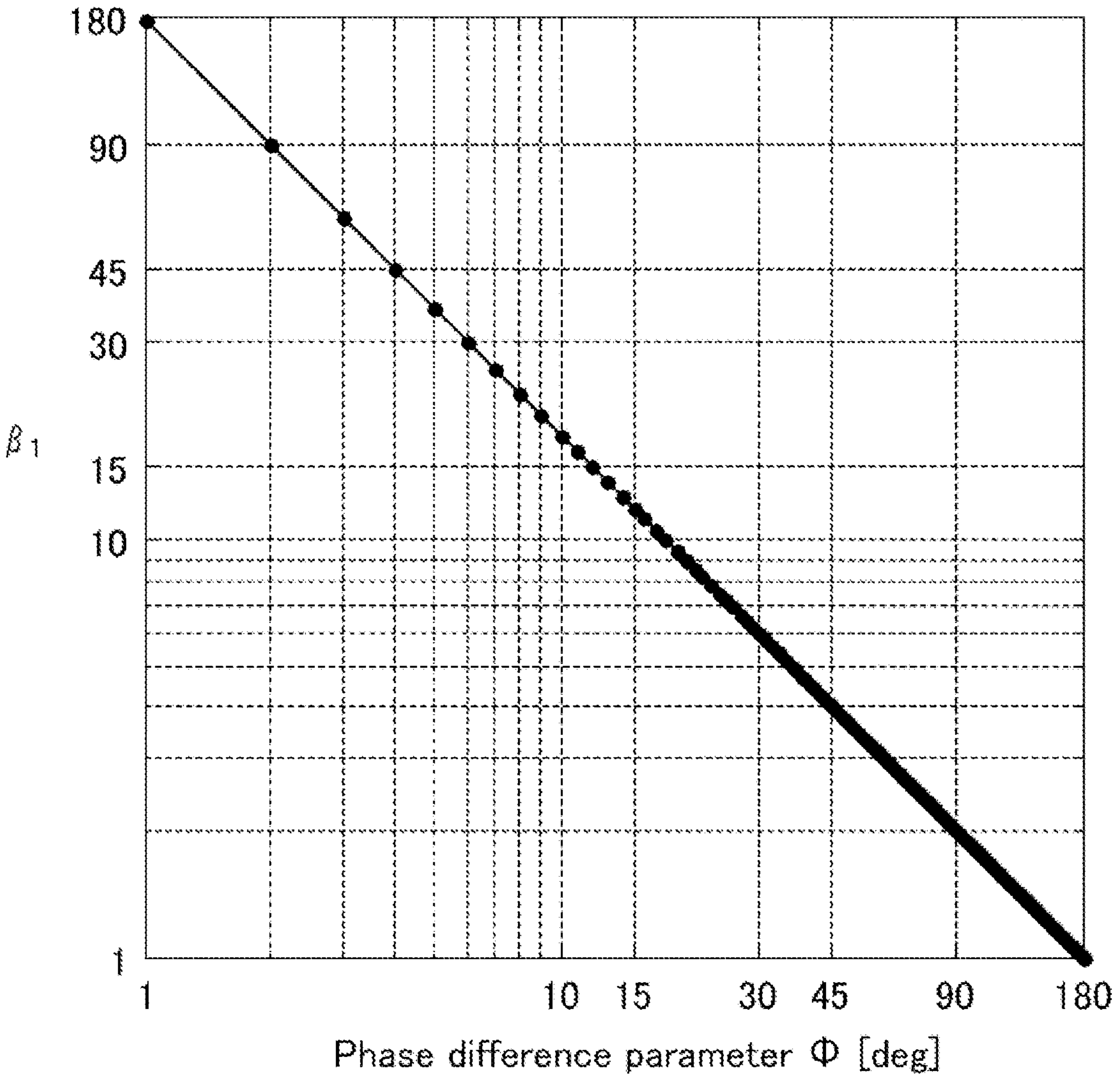
FIG. 14 is a diagram illustrating the relationship between the function 3*i* and the phase difference parameter in the form of a log-log graph.

FIG. 14 is a diagram illustrating the relationship between the function $\beta_1$ and the phase difference parameter $\varphi$ in the form of a log-log graph. As illustrated in FIG. 14, the function $\beta_1$ has a negative correlation with the phase difference parameter $\varphi$ and decreases substantially linearly on the log-log axis.

For convenience, the value of the function $\beta_1$ when the phase difference parameter $\varphi$ is 0° is assumed to be 180. In this case, the function $\beta_1$ can be expressed as, for example, "a function having a negative correlation with the phase difference parameter $\varphi$, and a function of the phase difference parameter $\varphi$ having a predetermined closed interval ([0,180] in the present embodiment) as a domain and a value range."

Figure 15:
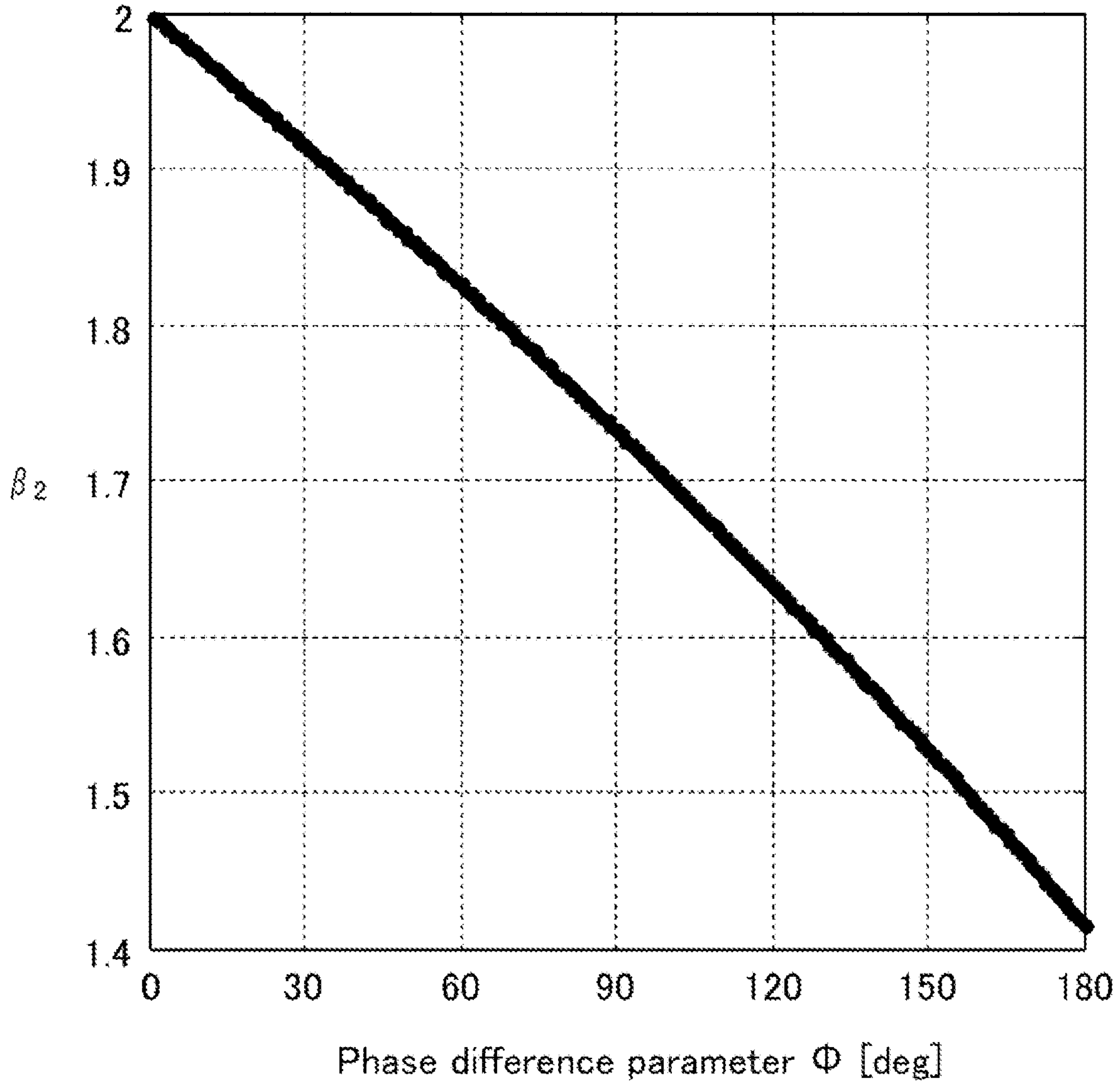
FIG. 15 is a diagram illustrating a relationship between the function $\beta_2$ and the phase difference parameter in a linear graph.

FIG. 15 is a diagram illustrating a relationship between the function $\beta_2$ and the phase difference parameter $\varphi$ in a linear graph. As illustrated in FIG. 15, the function $\beta_2$ has a negative correlation with the phase difference parameter $\varphi$, and decreases substantially linearly with a closed interval $[\sqrt{2}, 2]$ as a range on the linear axis.

As a variation, the function $\beta_2$ can also be represented by Equation 9 or Equation 10.

$$\beta_2^{(B)} = \sqrt{2}^{\frac{360-|\Phi|}{180}} \quad \text{(Equation 9)}$$

$$\beta_2^{(C)} = \frac{\beta_2^{(A)} + \beta_2^{(B)}}{2} \quad \text{(Equation 10)}$$

However, $$\beta_2^{(A)} = \sqrt{\frac{36|\Phi|}{90}}$$

Figure 16:
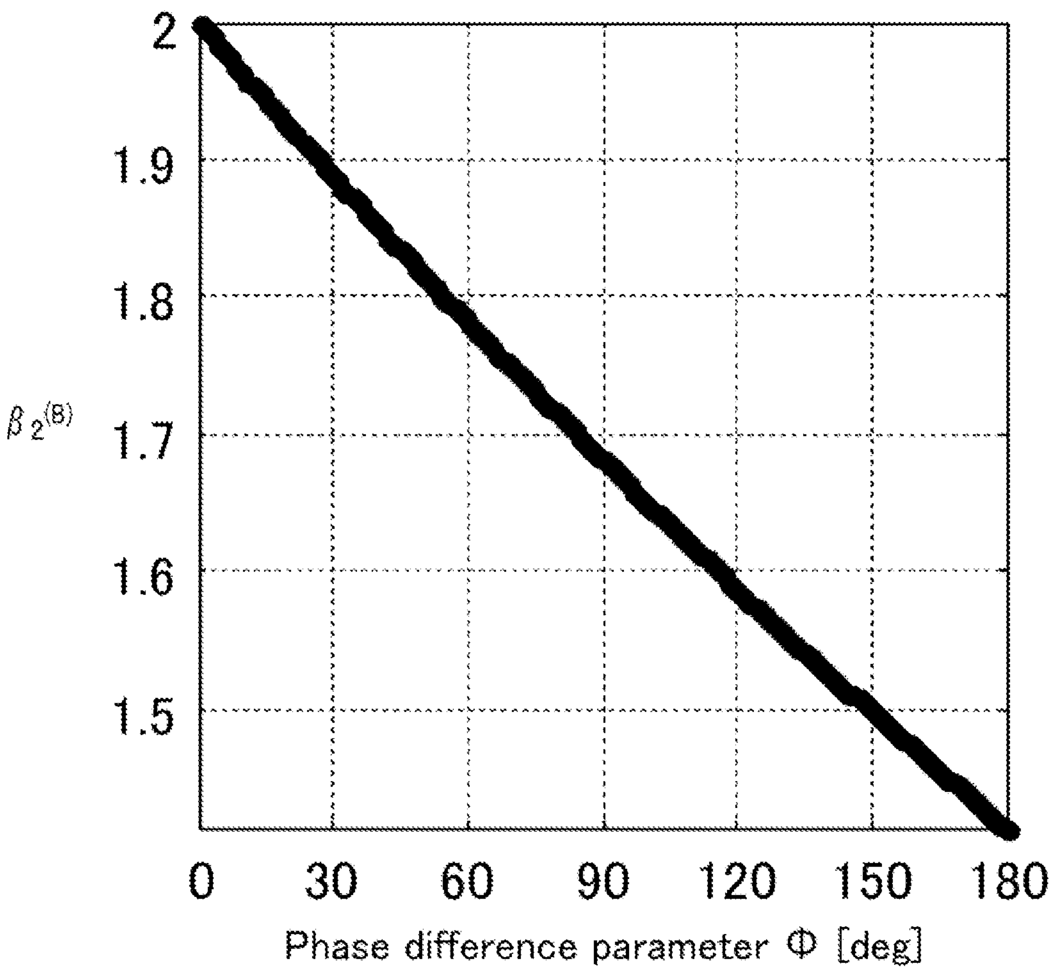
FIG. 16 is a diagram illustrating a relationship between the function $\beta_2{}^{(B)}$ and the phase difference parameter in a linear graph according to a variation.
Figure 17:
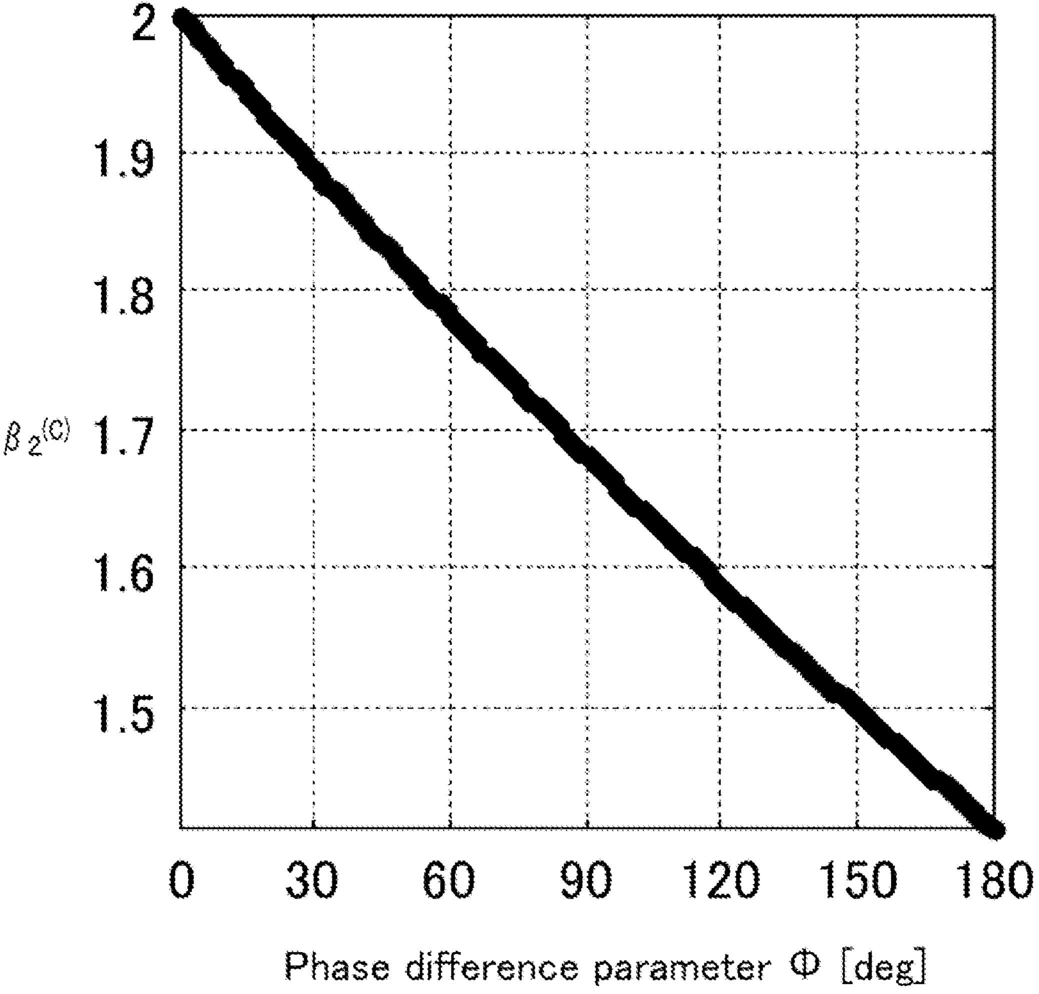
FIG. 17 is a diagram illustrating a relationship between the function $\beta_2{}^{(C)}$ and the phase difference parameter in a linear graph according to a variation.

FIG. 16 is a diagram illustrating the relationship between the function $\beta_2^{(B)}$ represented in Equation 9 and the phase difference parameter $\varphi$ in a linear graph. FIG. 17 is a diagram illustrating the relationship between the function $\beta_2^{(C)}$ represented in Equation 10 and the phase difference parameter $\varphi$ in a linear graph.

According to FIG. 15 to FIG. 17, the function $\beta_2$ can be expressed as, for example, "a function having a negative correlation with the phase difference parameter $\varphi$ and converging from 2 to $\sqrt{2}$ as the phase difference parameter $\varphi$ increases."

Figure 18:
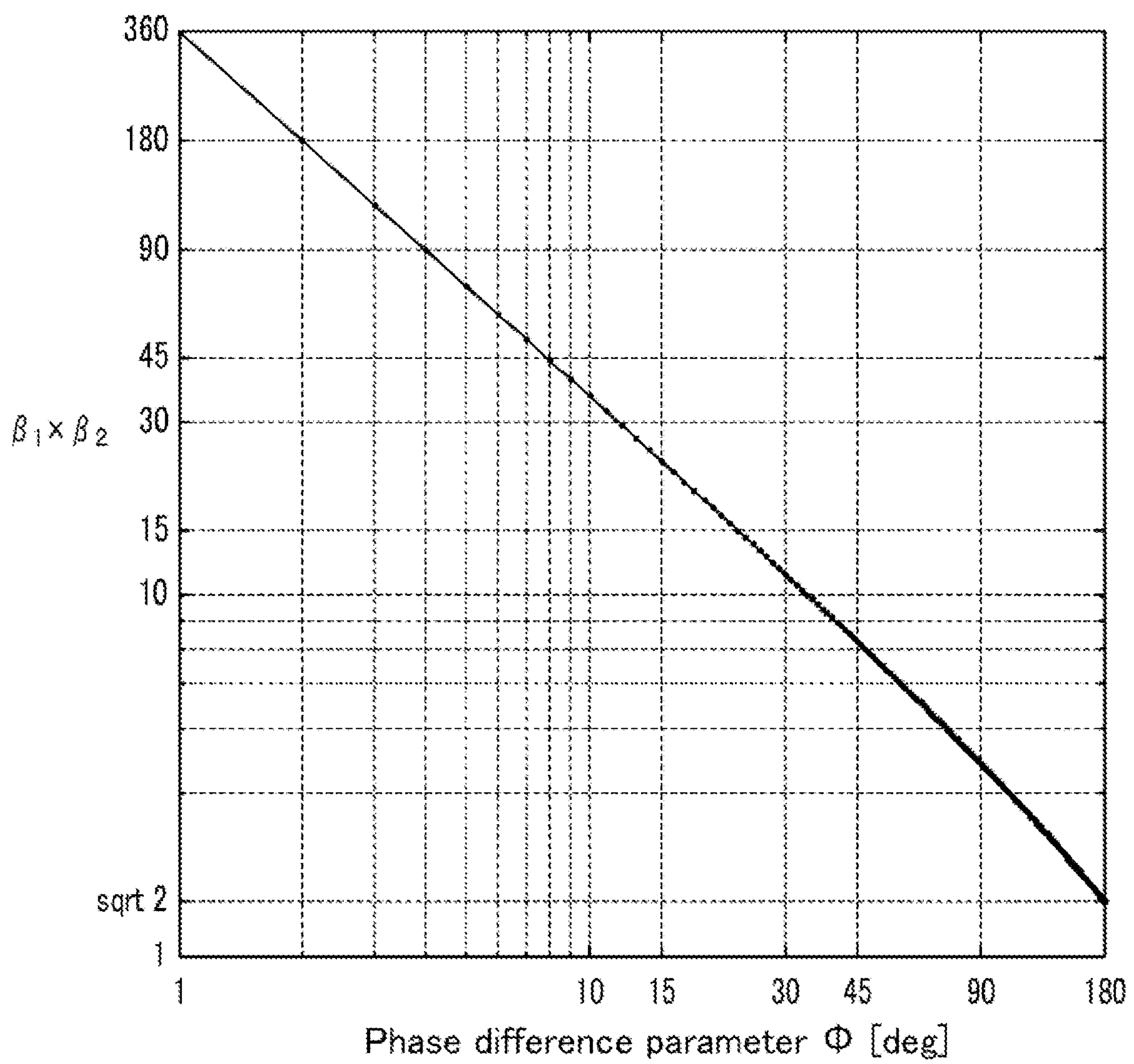
FIG. 18 is a diagram illustrating a relationship between the product of the function $\beta_1$ and the function $\beta_2{}^{(C)}$ and the phase difference parameter in a log-log graph.

FIG. 18 is a diagram illustrating a relationship between the product of the function $\beta_1$ and the function $\beta_2$ and the phase difference parameter $\varphi$ in a log-log graph. As illustrated in FIG. 18, the product of two functions also has a negative correlation with the phase difference parameter $\varphi$ and decreases substantially linearly on the log-log axis. For example, when the phase difference parameter $\varphi$ is 1°, the function $\beta_1$ is 180 and the function $\beta_2$ is approximately 2. Furthermore, for example, when the phase difference parameter $\varphi$ is 180°, the function $\beta_1$ is 1, and the function $\beta_2$ is $\sqrt{2}$. Therefore, as illustrated in FIG. 18, the product above takes a value of 360 to approximately $\sqrt{2}$ according to the phase difference parameter $\varphi$.

As described above, in step S102, the filter coefficient calculation unit 220 calculates the bandwidth $\beta$ of the filter based on the frequencies of the first control target and the frequencies of the second control target (that is, the band edge frequencies $f_C^+$ and $f_C^-$). In addition, the filter coefficient calculation unit 220 calculates the reference term $\beta_0$ based on the difference absolute value between the frequencies of the first and second control objects and the center frequency parameter $\omega$, and obtains the bandwidth $\beta$ by multiplying the calculated reference term $\beta_0$ by a function $\beta_1$ (an example of a third function) having a negative correlation with the phase difference parameter $\varphi$ and having a predetermined closed interval as a domain and a value range, and a function $\beta_2$ (an example of a fourth function) having a negative correlation with the phase difference parameter $\varphi$ and converging from 2 to $\sqrt{2}$ as the phase difference parameter $\varphi$ increases.

In step S103, the intermediate variable $\omega_0$ corresponding to the R channel is obtained by Equation 11, and the intermediate variable $\omega_0$ corresponding to the L channel is obtained by Equation 12.

$$\omega_0 = 2\pi f_C^+ \quad \text{(Equation 11)}$$

$$\omega_0 = 2\pi f_C^- \quad \text{(Equation 12)}$$

In step S104, the intermediate variable $\alpha_{fC}^+$ corresponding to the R channel is obtained by Equation 13, and the intermediate variable $\alpha_{fC}^-$ corresponding to the L channel is obtained by Equation 14. In Equation 13, the notation of "$f_C^+$" is exactly $\omega_0$ corresponding to the R channel, that is, "$2\pi f_C^+$." In addition, in Equation 14, the notation of "$f_C^-$" is exactly $\omega_0$ corresponding to the L channel, that is, "$2\pi f_C^-$."

$$\alpha_{f_c^+} = \sin(f_c^+)\sinh\left(\frac{\ln 2}{2}\cdot\beta\cdot\frac{f_c^+}{\sin f_c^+}\right) \quad \text{(Equation 13)}$$

$$\alpha_{f_c^-} = \sin(f_c^-)\sinh\left(\frac{\ln 2}{2}\cdot\beta\cdot\frac{f_c^-}{\sin f_c^-}\right) \quad \text{(Equation 14)}$$

In step S105, the filter coefficient group $FC_R$ is obtained by substituting the intermediate variable $\omega_0$ obtained by Equation 11 and the intermediate variable $\alpha f_C^+$ obtained by Equation 13 into Equation 5. Further, the filter coefficient group $FC_L$ is obtained by substituting the intermediate variable $\omega_0$ obtained by Equation 12 and the intermediate variable $\alpha_{fC}^-$ obtained by Equation 14 into Equation 5.

As described above, in steps S103 to S105, the filter coefficient calculation unit 220 calculates the filter coefficient group $FC_R$ (an example of the first filter coefficient group corresponding to one audio signal) based on the frequency and bandwidth of the first control target (that is, the band edge frequency $f_C^+$ and the bandwidth $\beta$), and calculates the filter coefficient group $FC_L$ (an example of the second filter coefficient group corresponding to the other audio signal) based on the frequency and bandwidth of the second control target (that is, the band edge frequency $f_C^-$ and the bandwidth $\beta$).

By the all-pass filter pair (the R filter unit 232 and the L filter unit 234) to which such a filter coefficient group is provided, the phase difference PH that satisfies the values of the center frequency parameter $\omega$, the quality factor parameter $\theta$, and the phase difference parameter $\varphi$ designated by the operator is provided to the audio signal $S_R$ and the audio signal $S_L$.

According to the present embodiment, since the filter can be set based on arbitrary values of the center frequency parameter $\omega$, the quality factor parameter $\theta$, and the phase difference parameter $\varphi$, the degree of freedom of the filter is higher than that of the conventional configuration. In other words, since the parameter values can be arbitrarily determined, the resolution of the phase difference that can be set for the audio signal $S_R$ and the audio signal $S_L$ is high. Further, by inputting a parameter value, a phase difference corresponding to the parameter value can be immediately provided to the audio signal $S_R$ and the audio signal $S_L$. Further, it is not necessary to secure a storage area for storing a large number of filter coefficients in the memory.

The above is a description of an exemplary embodiment of the present application. The embodiments of the present application are not limited to those described above, and various modifications are possible within the scope of the technical concept of the present invention. For example, appropriate combinations of embodiments and the like that are explicitly indicated by way of example in the specification or obvious embodiments and the like are also included in the embodiments of the present application.

For example, in the above description, an acoustic processing device 2 was shown that is provided with only one pair of all-pass filters, but a pair of all-pass filters is required for each band to which a phase difference is to be applied, for example. Therefore, the acoustic processing device 2 may be configured to include a plurality of pairs of all-pass filters so as to be able to apply phase differences to a plurality of bands.

In addition, in the above-described embodiment, the filter coefficient calculation unit 220 performs calculation using, for example, a logarithm, but may perform an equivalent calculation without using a logarithm.

In addition, in the above-described embodiment, the operator inputs each parameter value to the acoustic processing device 2. However, in another embodiment, for example, a higher-level program different from the program installed in the acoustic processing device 2 may automatically provide each parameter value to the acoustic processing device 2.

As an example, a device in which a higher program is installed acquires an image captured by an in-vehicle camera, extracts a person from the acquired captured image, and acquires a seating position of each extracted person. This device provides each parameter value to the acoustic processing device 2 for a transducer pair according to the acquired seating position. For example, when only a person seated in the driver's seat is extracted, the device provides each parameter value for the speakers $SP_{FR}$ and $SP_{FL}$ to the acoustic processing device 2. In addition, for example, when a person seated on the driver's seat and a person seated on the rear seat are extracted, the device provides each parameter value for the speakers $SP_{FR}$ and $SP_{FL}$ and two rear speakers (that is, each of two transducer pairs) to the acoustic processing device 2.

DESCRIPTION OF REFERENCE NUMERALS

1: Acoustic processing system
2: Acoustic processing device
3: Measuring device
10: Player
11: LSI
12: D/A converter
13: Amplifier
14: Display unit
15: Operation unit
16: Flash memory
210: Input reception unit
220: Filter coefficient calculation unit
230: Filter processing unit
232: R filter unit
234: L filter unit

The invention claimed is:

1. An acoustic processing device, comprising:

an input reception unit configured to receive an input of a value of a parameter defining a phase difference to be provided between a pair of audio signals, the pair of audio signals being left and right channel audio signals respectively corresponding to a pair of left and right speakers;

a filter coefficient calculation unit configured to calculate a filter coefficient group corresponding to each of the pair of audio signals based on the input value received by the input reception unit; and a filter processing unit including an all-pass filter configured to provide a phase difference defined by the input value between the pair of audio signals by performing filter processing on each of the pair of audio signals based on the filter coefficient group calculated by the filter coefficient calculation unit;

wherein the parameter includes a center frequency of the phase difference provided between the pair of audio signals, a quality factor, and a phase difference at the center frequency.

2. An acoustic processing device, comprising:

an input reception unit configured to receive an input of a value of a parameter defining a phase difference to be provided between a pair of audio signals;

a filter coefficient calculation unit configured to calculate a filter coefficient group corresponding to each of the pair of audio signals based on the input value received by the input reception unit; and a filter processing unit configured to provide a phase difference defined by the input value between the pair of audio signals by performing filter processing on each of the pair of audio signals based on the filter coefficient group calculated by the filter coefficient calculation unit;

wherein the parameter includes a center frequency of the phase difference provided between the pair of audio signals, a quality factor, and a phase difference at the center frequency;

wherein the filter coefficient calculation unit is configured to:

calculate a frequency of a first control target with respect to one of the pair of audio signals based on the input value and calculate a frequency of a second control target with respect to the other of the pair of audio signals based on the input value;

calculate a bandwidth of a filter based on the frequency of the first control target and the frequency of the second control target;

calculate a first filter coefficient group corresponding to the one audio signal based on the frequency and the bandwidth of the first control target; and calculate a second filter coefficient group corresponding to the other audio signal based on the frequency and the bandwidth of the second control target and the bandwidth.

3. The acoustic processing device according to claim 2, wherein the filter coefficient calculation unit is configured to:

provide the input value to a first function and a second function to obtain one of a pair of frequencies located symmetrically around the center frequency on a logarithmic axis as the frequency of the first control target and to obtain the other of the pair of frequencies as the frequency of the second control target, and a difference value between the first function and the second function has a negative correlation with the parameter of the quality factor and a positive correlation with the parameter of the phase difference at the center frequency.

4. The acoustic processing device according to claim 2, wherein the filter coefficient calculation unit is configured to:

calculate a reference term based on the center frequency and a difference absolute value between the frequency of the first control target and the frequency of the second control target; and obtain the bandwidth by multiplying the calculated reference term by a third function having a negative correlation with the parameter of the phase difference at the center frequency and having a predetermined closed interval as a domain and a value range, and a fourth function having a negative correlation with the parameter of the phase difference at the center frequency and converging from 2 to $\sqrt{2}$ as the parameter of the phase difference at the center frequency increases.

5. The acoustic processing device according to claim 2, wherein the filter processing unit comprises a first all-pass filter and a second all-pass filter;

the first filter coefficient group is a filter coefficient group applied to the first all-pass filter; and the second filter coefficient group is a filter coefficient group applied to the second all-pass filter.

6. An acoustic processing method for execution in a computer, the method comprising the steps of:

receiving an input of a value of a parameter defining a phase difference to be provided between a pair of audio signals, the pair of audio signals being left and right channel audio signals respectively corresponding to a pair of left and right speakers;

calculating a filter coefficient group corresponding to each of the pair of audio signals based on the received input value; and providing the phase difference by an all-pass filter, the phase difference being defined by the input value between the pair of audio signals by performing filter processing on each of the pair of audio signals based on the calculated filter coefficient group;

wherein the parameter includes a center frequency of the phase difference provided between the pair of audio signals, a quality factor, and a phase difference at the center frequency.

* * * * *